(12) United States Patent
Park et al.

(10) Patent No.: US 9,093,454 B2
(45) Date of Patent: Jul. 28, 2015

(54) SEMICONDUCTOR DEVICES HAVING FINE PATTERNS

(71) Applicant: Samsung Electronics Co., Ltd., Suwon-si, Gyeonggi-do (KR)

(72) Inventors: Sang-Yong Park, Suwon-si (KR); Jae-Hwang Sim, Hwasung-si (KR); Young-Ho Lee, Seoul (KR); Kyung-Lyul Moon, Seoul (KR); Jae-Kwan Park, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 4 days.

(21) Appl. No.: 14/186,617

(22) Filed: Feb. 21, 2014

(65) Prior Publication Data

US 2014/0167290 A1    Jun. 19, 2014

Related U.S. Application Data

(60) Division of application No. 12/639,542, filed on Dec. 16, 2009, now Pat. No. 8,686,563, which is a continuation of application No. 12/290,420, filed on Oct. 30, 2008, now Pat. No. 8,057,692.

(30) Foreign Application Priority Data

Jun. 17, 2008 (KR) .......................... 10-2008-0057020

(51) Int. Cl.
*H01L 23/48*    (2006.01)
*H01L 23/52*    (2006.01)
(Continued)

(52) U.S. Cl.
CPC .......... *H01L 23/528* (2013.01); *H01L 21/0337* (2013.01); *H01L 21/0338* (2013.01);
(Continued)

(58) Field of Classification Search
CPC ............ H01L 21/0337; H01L 21/0338; H01L 21/32139; H01L 21/76838; H01L 21/823456
USPC ............ 257/773, 775, 786, E23.01, E23.141, 257/E23.151
See application file for complete search history.

(56) References Cited

U.S. PATENT DOCUMENTS 5,708,298 A * 1/1998 Masayuki et al. ............. 257/723
6,034,438 A * 3/2000 Petersen ....................... 257/786
(Continued)

FOREIGN PATENT DOCUMENTS

| CN | 101044596 | 9/2007 |
| CN | 101164147 | 4/2008 |
| JP | 2007-305970 | 11/2007 |

OTHER PUBLICATIONS

"Methods of Forming Fine Patterns in the Fabrication of Semiconductor Devices" Specification, Drawings, and Prosecution History of U.S. Appl. No. 12/290,420, filed Oct. 30, 2008, by Sang-Yong Park, et al.

(Continued)

*Primary Examiner* — Hung Vu
(74) *Attorney, Agent, or Firm* — Onello & Mello, LLP

(57) ABSTRACT

In a method of forming a semiconductor device, a feature layer is provided on a substrate and a mask layer is provided on the feature layer. A portion of the mask layer is removed in a first region of the semiconductor device where fine features of the feature layer are to be located, the mask layer remaining in a second region of the semiconductor device where broad features of the feature layer are to be located. A mold mask pattern is provided on the feature layer in the first region and on the mask layer in the second region. A spacer layer is provided on the mold mask pattern in the first region and in the second region. An etching process is performed to etch the spacer layer so that spacers remain at sidewalls of pattern features of the mold mask pattern, and to etch the mask layer in the second region to provide mask layer patterns in the second region. The feature layer is etched using the mask layer patterns as an etch mask in the second region and using the spacers as an etch mask in the first region to provide a feature layer pattern having fine features in the first region and broad features in the second region.

16 Claims, 15 Drawing Sheets

(51) Int. Cl.
*H01L 23/528* (2006.01)
*H01L 21/033* (2006.01)
*H01L 21/3213* (2006.01)
*H01L 21/768* (2006.01)
*H01L 21/8234* (2006.01)
*H01L 27/115* (2006.01)

(52) U.S. Cl.
CPC .... *H01L21/32139* (2013.01); *H01L 21/76838* (2013.01); *H01L 21/823456* (2013.01); *H01L 27/115* (2013.01); *H01L 2924/0002* (2013.01)

(56) References Cited

U.S. PATENT DOCUMENTS

| | | | |
|---|---|---|---|
| 6,475,891 | B2 | 11/2002 | Moon |
| 6,602,779 | B1 | 8/2003 | Li et al. |
| 6,689,695 | B1 | 2/2004 | Lui et al. |
| 6,723,607 | B2 | 4/2004 | Nam et al. |
| 7,115,525 | B2 | 10/2006 | Abatchev et al. |
| 7,253,118 | B2 | 8/2007 | Tran et al. |
| 7,279,794 | B2 * | 10/2007 | Yuzawa .................. 257/773 |
| 7,390,746 | B2 | 6/2008 | Bai et al. |
| 7,547,640 | B2 | 6/2009 | Abatchev et al. |
| 7,629,693 | B2 | 12/2009 | Abatchev et al. |
| 7,687,408 | B2 | 3/2010 | Abatchev et al. |
| 7,872,358 | B2 | 1/2011 | Yuzawa |
| 7,911,069 | B2 | 3/2011 | Fuse |
| 7,928,580 | B2 * | 4/2011 | Saito .................. 257/775 |
| 8,216,949 | B2 | 7/2012 | Abatchev et al. |
| 2002/0068447 | A1 | 6/2002 | Moon |
| 2003/0119307 | A1 | 6/2003 | Bekiaris et al. |
| 2003/0230234 | A1 | 12/2003 | Nam et al. |
| 2006/0046484 | A1 | 3/2006 | Abatchev et al. |
| 2006/0258162 | A1 | 11/2006 | Abatchev et al. |
| 2006/0262511 | A1 | 11/2006 | Abatchev et al. |
| 2007/0049040 | A1 | 3/2007 | Bai et al. |
| 2007/0117310 | A1 | 5/2007 | Bai et al. |
| 2007/0148984 | A1 | 6/2007 | Abatchev et al. |
| 2008/0006869 | A1 * | 1/2008 | Kamigaichi et al. .......... 257/315 |
| 2008/0017992 | A1 | 1/2008 | Kito et al. |
| 2008/0220600 | A1 | 9/2008 | Alapati et al. |
| 2010/0203727 | A1 | 8/2010 | Abatchev et al. |
| 2011/0117743 | A1 | 5/2011 | Bai et al. |

OTHER PUBLICATIONS

"Methods of Forming Fine Patterns in the Fabrication of Semiconductor Devices" Specification, Drawings, and Prosecution History of U.S. Appl. No. 12/639,542, filed Dec. 16, 2009, by Sang-Yong Park, et al.

* cited by examiner

SEMICONDUCTOR DEVICES HAVING FINE PATTERNS

RELATED APPLICATIONS

This application is a divisional application of U.S. patent application Ser. No. 12/639,542, filed on Dec. 16, 2009, which is a continuation of U.S. application Ser. No. 12/290, 420, filed on Oct. 30, 2008, which claims priority under 35 U.S.C. 119 to Korean Patent Application No. 10-2008-0057020, filed on Jun. 17, 2008, the contents of which are incorporated herein by reference in their entirety.

BACKGROUND

With the continued emphasis on highly integrated electronic devices, there is an ongoing need for semiconductor memory devices that operate at higher speeds and lower power and that have increased device density. To accomplish this, there is a pressing need to form devices with aggressive scaling of miniaturized device patterns of ever-smaller line widths.

With increased pressure on the design rules, including, for example, structure size and pitch of semiconductor devices, it has become increasingly difficult to form sufficiently fine pitch patterns due to the resolution limitations of conventional photolithography processes that are used to form the patterns. However, such finely dimensioned line and space patterns, known as "L/S patterns" are critical to device design and integration.

Among the various methods proposed to improve the resolution of conventional photolithography processes, one method, known as the self-aligned-reverse patterning method, or SARP method, has enjoyed widespread popularity. In this approach, a first photolithography pattern is applied to an underlying layer to be patterned. The first photolithography deposition applies structures that are at or near the size and pitch resolution limitations of the photolithography system. A spacer layer is deposited on the resulting structures. The spacer layer is anisotropically etched to form spacers at sidewalls of the structures. The resulting dimensions of the spacers can be accurately controlled by controlling the etch parameters. The original structures are removed, and the spacers remain as an etch mask that can be used to pattern the underlying layer, to result in structures that are finer in width and closer in pitch that that attainable by the photolithography system itself.

There are certain limitations, however, that limit the success of this approach. For example, in a case where certain high-density regions of a device are to include high-density patterns having relatively narrower width and tighter pitch, and low-density regions of a device are to include low-density patterns having relatively larger width and are more spaced apart in pitch, the low-density patterns and high-density patterns are patterned at different times, using different processes. For example, the low-density patterns can be patterned using conventional photolithography tooling, and the high-density patterns, on the same device, are patterned using the SARP approach. As a result, misalignment can occur between the low-density patterns and the high-density patterns, as they are patterned at different times. Also, since they are patterned at different times, extra photolithography steps are required, increasing manufacturing costs.

SUMMARY

Embodiments of the present invention are directed to methods of forming semiconductor devices having both fine patterns, or features, in a first region, and broad patterns, or features, in a second region in a manner that addresses the limitations associated with conventional approaches. In particular, the fine features and broad features of a layer to be patterned, or feature layer, can be formed at the same time, eliminating the possibility of their respective misalignment, and simplifying fabrication by reducing the number of photolithography steps required. This results in a more-reliable fabrication process that is more economical for production of the end-device.

In one aspect, a method of forming a semiconductor device comprises: providing a feature layer on a substrate; providing a mask layer on the feature layer; removing a portion of the mask layer in a first region of the semiconductor device where fine features of the feature layer are to be located, the mask layer remaining in a second region of the semiconductor device where broad features of the feature layer are to be located; providing a mold mask pattern on the feature layer in the first region and on the mask layer in the second region; providing a spacer layer on the mold mask pattern in the first region and in the second region; performing an etching process to etch the spacer layer so that spacers remain at sidewalls of pattern features of the mold mask pattern, and to etch the mask layer in the second region to provide mask layer patterns in the second region; and etching the feature layer using the mask layer patterns as an etch mask in the second region and using the spacers as an etch mask in the first region to provide a feature layer pattern having fine features in the first region and broad features in the second region.

In one embodiment, performing an etching process to etch the mask layer in the second region is performed using the mold mask pattern and spacers as an etch mask.

In another embodiment, the semiconductor device is a memory device, wherein the first region is a cell region of the memory device and wherein the second region is peripheral region of the memory device.

In another embodiment, the feature layer comprises a conductive layer on the substrate.

In another embodiment, the feature layer patterns comprise gate patterns of the semiconductor device.

In another embodiment, the feature layer patterns comprise interconnect lines of the semiconductor device.

In another embodiment, the interconnect lines comprise bit lines of the semiconductor device.

In another embodiment, the feature layer pattern comprises a second mask layer pattern used to define regions in the substrate.

In another embodiment, the defined regions are active regions of the substrate.

In another embodiment, providing the mask layer comprises providing a first mask layer on the feature layer and providing a second mask layer on the first mask layer.

In another embodiment, removing a portion of the mask layer in the first region, the mask layer remaining in a second region of the semiconductor device comprises: removing a portion of the second mask layer in the first region, the second mask layer remaining in a second region of the semiconductor device, and the first mask layer remaining in the first and second regions of the semiconductor device; and wherein etching the feature layer further comprises etching the first mask layer in the first region and in the second region.

In another embodiment, providing the first mask layer on the feature layer and providing a second mask layer on the first mask layer comprises sequentially providing first and second sub-mask layers on the feature layer and providing the second mask layer on the second sub-mask layer.

In another embodiment, the method further comprises, following performing an etching process to etch the mask layer in the second region to provide mask layer patterns in the second region: applying a separation mask in the second region, the separation mask exposing at least one mask layer pattern in the second region; and etching the exposed portion of the at least one mask layer pattern in the second region to separate the at least one mask layer pattern into first and second separated mask layer patterns, and wherein etching the feature layer using the mask layer patterns as an etch mask in the second region comprises etching the feature layer using the first and second separated mask layer patterns as an etch mask.

In another aspect, a method of forming a memory system including: a memory controller that generates command and address signals; and a memory module comprising a plurality of memory devices is provided. The memory module receives the command and address signals and in response stores and retrieves data to and from at least one of the memory devices, wherein each memory device comprises: a plurality of addressable memory cells in a cell region of the memory device; and a decoder in a peripheral region of the memory device that receives an address from an external source, and that generates a row signal and a column signal for accessing at least one of the addressable memory cells during programming and read operations. The method further comprises forming the memory device comprising: providing a feature layer on a semiconductor substrate; providing a mask layer on the feature layer; removing a portion of the mask layer in the cell region of the memory device where fine features of the feature layer are to be located, the mask layer remaining in the peripheral region of the memory device where broad features of the feature layer are to be located; providing a mold mask pattern on the feature layer in the cell region and on the mask layer in the peripheral region; providing a spacer layer on the mold mask pattern in the cell region and in the peripheral region; performing an etching process to etch the spacer layer so that spacers remain at sidewalls of pattern features of the mold mask pattern, and to etch the mask layer in the peripheral region to provide mask layer patterns in the peripheral region; and etching the feature layer using the mask layer patterns as an etch mask in the peripheral region and using the spacers as an etch mask in the cell region to provide a feature layer pattern having fine features in the cell region and broad features in the peripheral region.

In one embodiment, performing an etching process to etch the mask layer in the peripheral region is performed using the mold mask pattern and spacers as an etch mask.

In another embodiment, the feature layer comprises a conductive layer on the substrate.

In another embodiment, the feature layer patterns comprise gate patterns of the memory device.

In another embodiment, the feature layer patterns comprise interconnect lines of the memory device.

In another embodiment, the interconnect lines comprise bit lines of the memory device.

In another embodiment, the feature layer pattern comprises a second mask layer pattern used to define regions in the semiconductor substrate.

In another embodiment, the defined regions are active regions of the semiconductor substrate.

In another embodiment, providing the mask layer comprises providing a first mask layer on the feature layer and providing a second mask layer on the first mask layer.

In another embodiment, removing a portion of the mask layer in the cell region, the mask layer remaining in the peripheral region of the semiconductor device comprises: removing a portion of the second mask layer in the cell region, the second mask layer remaining in the peripheral region of the memory device, and the first mask layer remaining in the cell and peripheral regions of the memory device; and wherein etching the feature layer further comprises etching the first mask layer in the cell region and in the peripheral region.

In another embodiment, providing the first mask layer on the feature layer and providing a second mask layer on the first mask layer comprises sequentially providing first and second sub-mask layers on the feature layer and providing the second mask layer on the second sub-mask layer.

In another embodiment, the method further comprises, following performing an etching process to etch the mask layer in the peripheral region to provide mask layer patterns in the peripheral region: applying a separation mask on the peripheral region, the separation mask exposing at least one mask layer pattern in the peripheral region; and etching the exposed portion of the at least one mask layer pattern in the peripheral region to separate the at least one mask layer pattern into first and second separated mask layer patterns, and wherein etching the feature layer using the mask layer patterns as an etch mask in the peripheral region comprises etching the feature layer using the first and second separated mask layer patterns as an etch mask.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIGS. 4A-14A are top plan views of a method for forming fine patterns and broad patterns in the example NAND-flash memory device of FIG. 3, in accordance with embodiments of the present invention. FIGS. 4B-14B are cross-sectional views taken along section lines A-A', B-B', and C-C' of FIGS. 4A-14A, in accordance with embodiments of the present invention

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or above, or connected or coupled to, the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
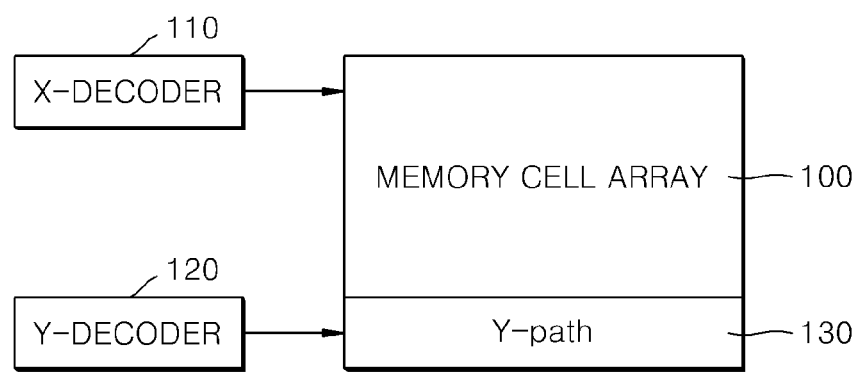
FIG. 1 is a block diagram of a NAND-flash memory device, illustrating an example application of the embodiments the present invention.
Figure 2:
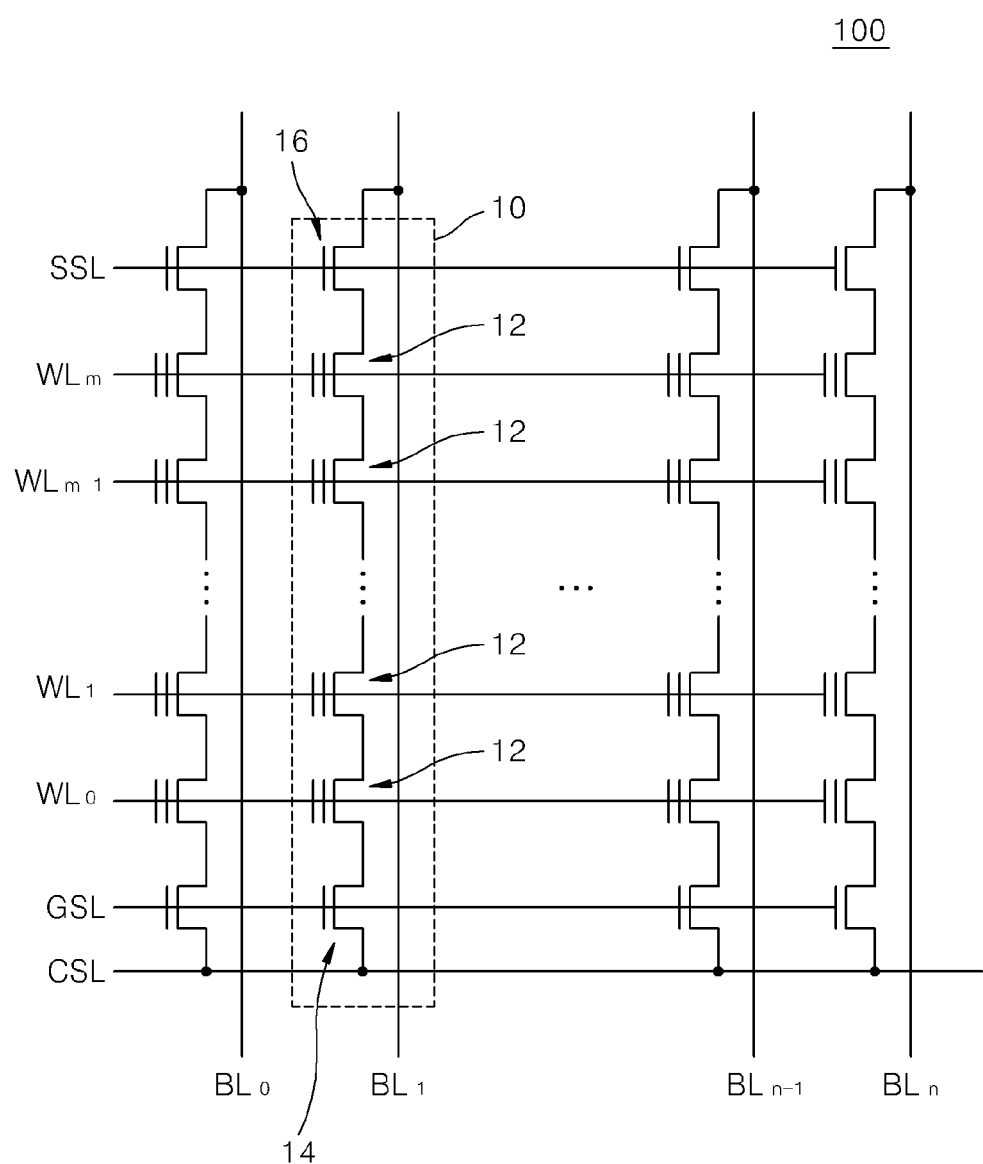
FIG. 2 is a schematic diagram of the device of FIG. 1.

FIG. 1 is a block diagram of a NAND-flash memory device, illustrating an example application of the embodiments the present invention. FIG. 2 is a schematic diagram of the device of FIG. 1. Referring to FIGS. 1 and 2, a memory device, such as a NAND-flash memory device includes a memory cell array 100 comprising an array of memory cells arranged in a high-density configuration. Peripheral circuitry for accessing and driving the array includes an X-decoder block 110 responsible for selecting a word line WL of the cell array 100 to be accessed, for example, word lines $WL_0$-$WL_m$. A Y-decoder block 120 is responsible for selecting a bit line BL of the cell array 100 to be activated, for example, bit lines $BL_0$-$BL_n$. A Y-path circuit 130 connected to the cell array 100 is responsible for assigning the bit line path based on the output of the Y-decoder block 120.

Referring to FIG. 2, a cell string 10 of the memory cell array 100 includes a string select transistor 16, a plurality of memory cell transistors 12, and a ground select transistor 14 connected in series. A gate of the string select transistor 16 is connected to the string select line SSL and a gate of the ground select transistor 14 is connected to the ground select line GSL. A gate of each memory cell transistor 12 in the string 16 is connected to one of the word lines $WL_0$-$WL_m$. The memory cell transistors 12 include charge storage structures and thereby operate as non-volatile devices which retain information after power is removed from the device. Bit lines $BL_0$-$BL_n$ of the device are connected between output terminals of string select transistors SSL of a common row.

Figure 3:
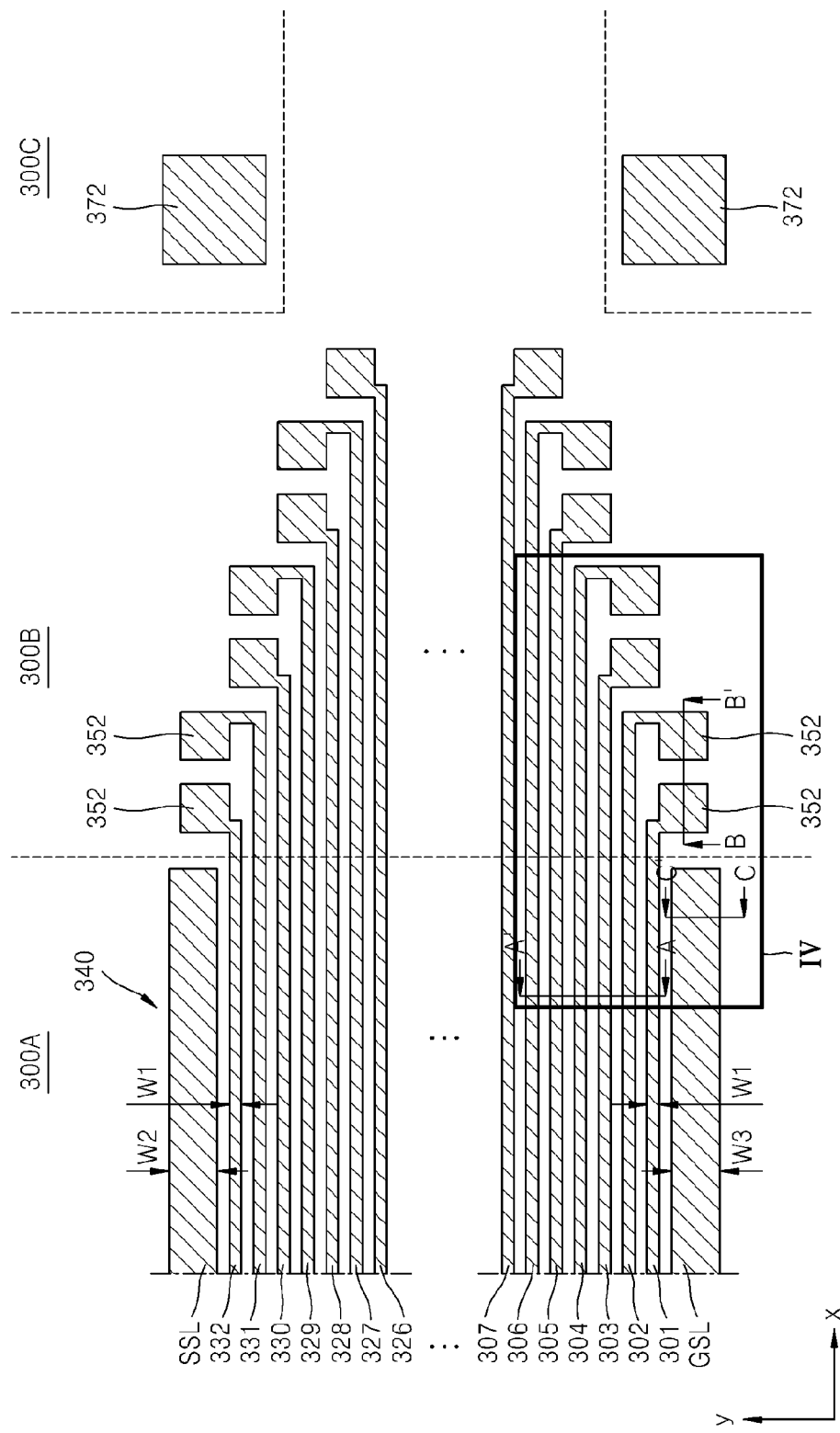
FIG. 3 is top layout view of a NAND-flash memory device, formed in accordance with embodiments of the present invention.

FIG. 3 is top layout view of the example NAND-flash memory device of FIGS. 1 and 2 above, formed in accordance with embodiments of the present invention. Referring to FIG. 3, a memory device, such as a NAND flash memory, commonly includes a number of different circuit regions, each having circuit structures with certain size and pitch characteristics. For example, the device of FIG. 3 includes a cell array region 300A, a cell contact region 300B and a peripheral circuit region 300C. In one example, the broadly patterned X-decoder and Y-decoder circuitry of FIG. 1 can be formed in the peripheral circuit region 300C of the device, where design constraints are not as stringent. At the same time, the memory cell array 100 can be formed in the memory cell region 300A of the device. In general, the memory cell region 300A has the highest demand for density in the device, and therefore, finely patterned structures are desired in the memory cell region 300A. The cell contact region 300B serves as the interface between the memory cell region 300A and the peripheral circuit region. Therefore, in the cell contact region 300B, it is common to have both finely patterned structures and broadly patterned structures.

For purposes of the present disclosure, the terms "broad", "broadly", "wide" and the like when referring to patterning of layers, features, or structures of a device refer to patterns, features, or structures that can be formed using conventional photolithographic techniques and dimensioned or spaced apart from each other by distances that are at least as large as those readily attained under the resolution of the photolithography system. The terms "fine", "finely", "narrow" and the like when referring to patterning of layers, features, or structures of a device refer to patterns, features, or structures that cannot be formed using conventional photolithographic techniques and are dimensioned or spaced apart from each other by distances that are less than those readily attained under the resolution of the photolithography system used in their formation. For example, patterns, features, or structures that are "fine" or "narrow" may require the use of sidewall spacers and etching techniques in defining their eventual geometries and spacings.

It can be seen in the highlighted region identified within Box IV, that patterns of various widths are desired to be formed. For example, the conductive lines 301 . . . 332 comprising, for example, conductive lines for bit lines and word lines of the device, are patterns of a fine width W1 and are at a fine pitch. At the same time, the string select line SSL, in parallel with the conductive lines 301 . . . 332, is formed at a much broader width of W2, while the ground select line GSL, likewise in parallel with the conductive lines 301 . . . 332, is formed at a much broader width of W3. Also, in the cell contact region 300B, it can be seen that relatively broadly patterned contacts 352 are required for the relatively narrowly patterned conductive lines 301 . . . 332.

Embodiments of the present invention provide fabrication techniques for forming both narrowly patterned features and broadly patterned features in a manner that mitigates or eliminates the possibility of their respective misalignment, and that simplifies fabrication by reducing the number of photolithography steps required. This results in a more-reliable fabrication process that is more economical for production of the end-device.

FIGS. 4A-14A are top plan views of a method for forming fine patterns and broad patterns in the example NAND-flash memory device of FIG. 3, in accordance with embodiments of the present invention. FIGS. 4B-14B are cross-sectional views taken along section lines A-A', B-B', and C-C' of FIGS. 4A-14A, in accordance with embodiments of the present invention.

In particular FIGS. 4A-14A and 4B-14B illustrate formation of the patterns illustrated in Box IV of FIG. 3 for illustrating the principles of the embodiments of the present specification.

Figure 4A:
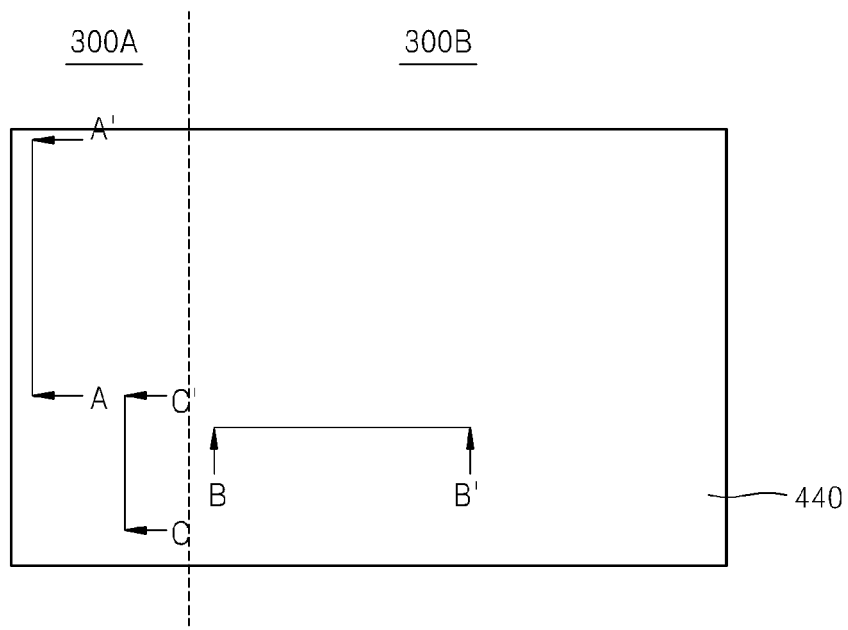
Figure 4B:
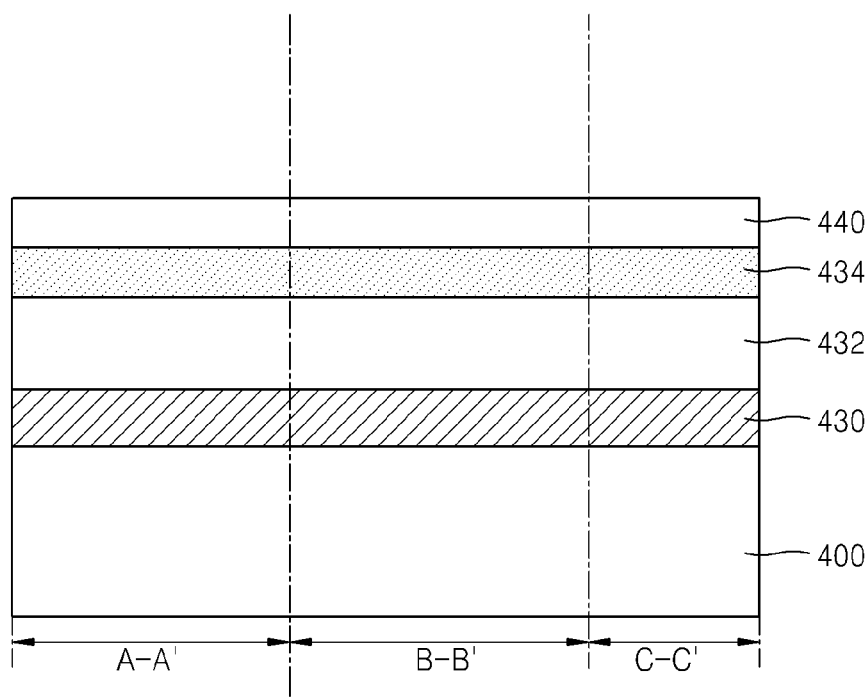

Referring to FIGS. 4A and 4B, a layer to be patterned 430, or feature layer, is provided on a substrate 400. The layer to be patterned 430 can be formed of any of a number of relevant materials. In one example, the layer to be patterned 430 can comprise an active region, or other region, of the substrate 400 itself, such as a semiconductor substrate 400. In another example, the layer to be patterned can itself comprise a masking layer that is used to define patterns in an underlying substrate or material layer. In this case, the layer to be patterned 430 can be a mask layer used to define regions of the substrate 400. In another example, the layer to be patterned 430 can comprise a conductive layer that is formed on an underlying insulating layer in turn formed on the substrate 400. In another example, the layer to be patterned 430 can comprise a gate electrode of a transistor. In another example, the layer to be patterned 430 can comprise a conductive line of a device, such as a bit line or word line of the device. When forming a gate electrode, the layer to be patterned 430 can comprise, for example, a material selected from the group consisting of TaN, TiN, W, WN, HfN, and WSi, and a combination of two or more of these materials. When forming a bit line, the layer to be patterned 430 can comprise, for example, a metal or metal alloy material, such as tungsten or aluminum. In a case where the layer to be patterned 430 comprises a conductive layer that requires isolation from the underlying substrate 400, and insulative layer (not shown) can be provided between the layer to be patterned 430 and the substrate.

A first hard mask layer 432 is applied to the layer to be patterned 430. An optional second hard mask layer 434 and optional third hard mask layer 440 can be applied to the first hard mask layer 432. In a case where first and second hard mask layers 432, 434 are used, the first and second hard mask layers 432, 434 should have etch selectivity with respect to each other. In a case where first, second, and third hard mask layers 432, 434, 440 are used, the first and third hard mask layers 432, 440 should have etch selectivity with respect to the second hard mask layer 434. Additional hard mask layers can be applied accordingly, as desired.

In various examples, the hard mask layers 432, 434, 440 can comprise any of a number of suitable materials. In one embodiment, the first hard mask layer 432 can comprise oxide, in which case the second hard mask layer 434 can comprise polysilicon or nitride. The third hard mask layer 440 can comprise a material having the same etch selectivity as that of the first hard mask layer 432; therefore, in this example, the third hard mask layer 440 can comprise oxide. Other suitable materials for the hard mask layers 432, 434, 440 are equally applicable to the embodiments of the present specification.

Figure 5A:
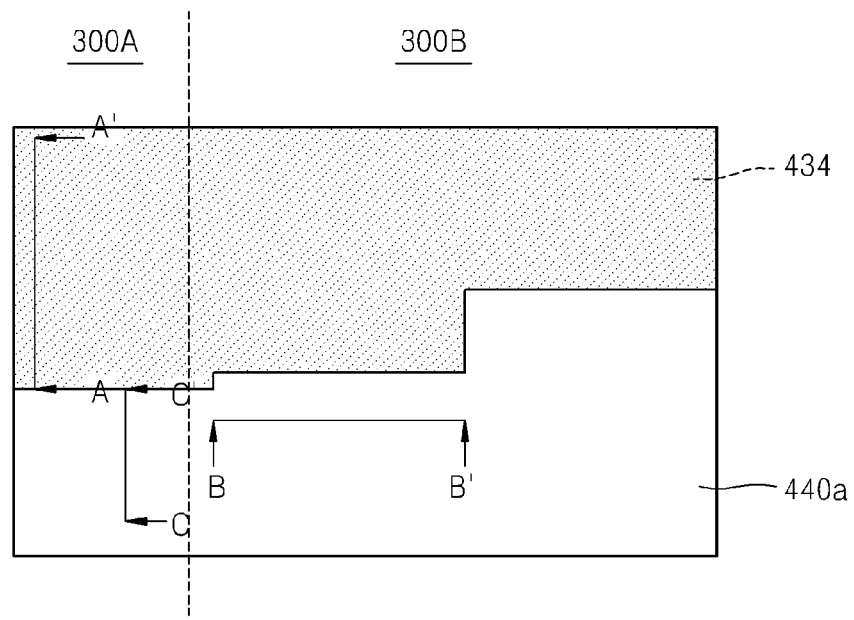
Figure 5B:
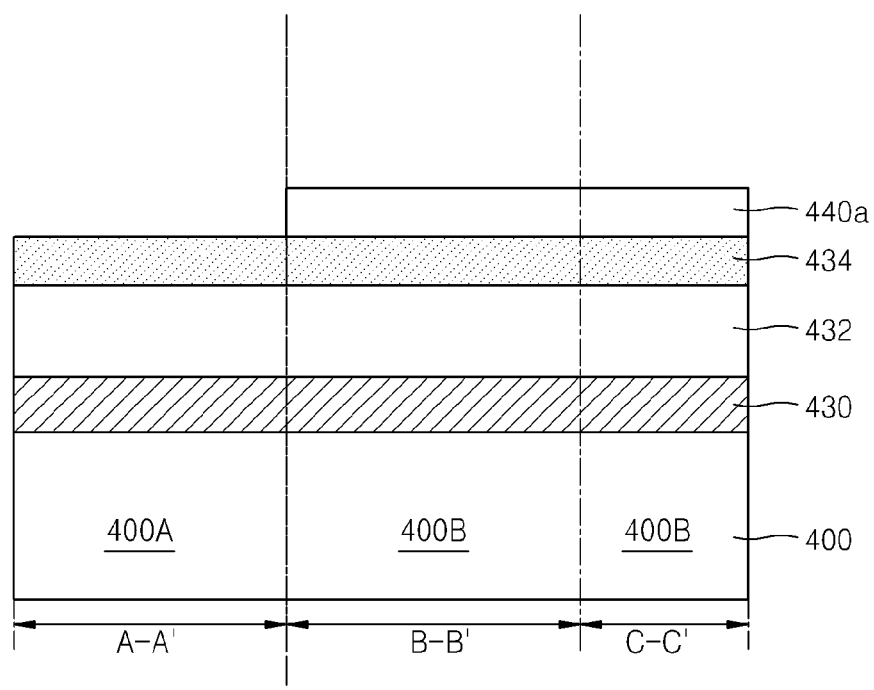

Referring to FIGS. 5A and 5B, the third hard mask layer 440 is patterned to remove the third hard mask layer 440 in regions or portions of the device where fine, or narrow, features of the feature layer, or layer to be patterned 430, are to be located. At the same time, the resulting third hard mask layer pattern 440a remains in regions or portions of the device where broad features of the feature layer, or layer to be patterned 430, are to be located. In this example, the third hard mask layer pattern 440a exposes regions of the device where the relatively fine, or narrow, conductive lines 301 . . . 332 are to be formed. At the same time, the third hard mask layer pattern 440a remains in regions of the device where the relatively broad ground select line GSL and contacts 352 are to be formed. Alternatively, in a case where only one or two hard mask layers are employed, an upper most hard mask layer of the hard mask layers 432, 434 is patterned as described above.

Figure 6A:
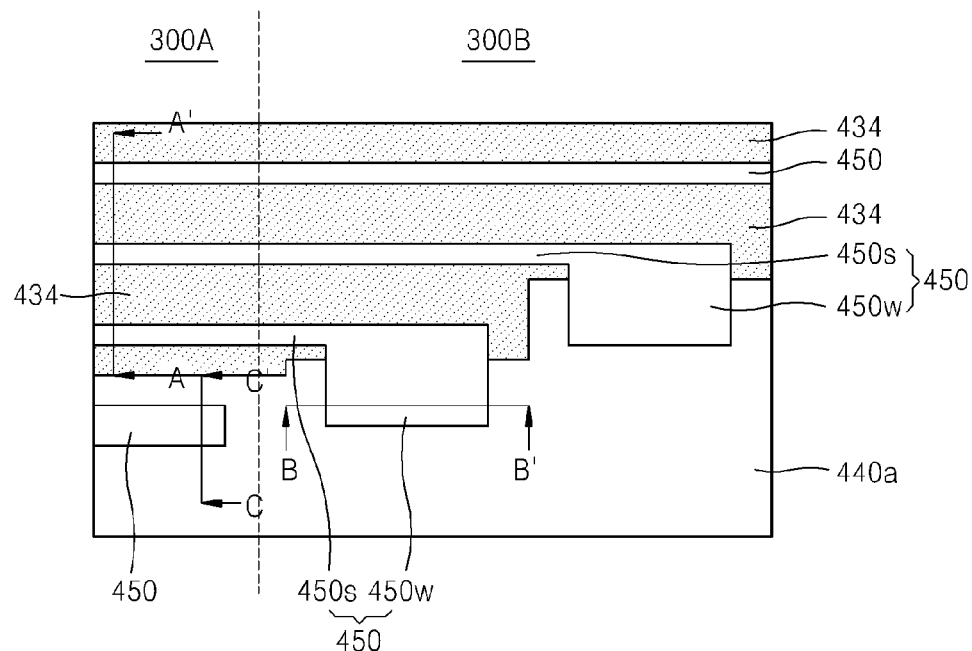
Figure 6B:
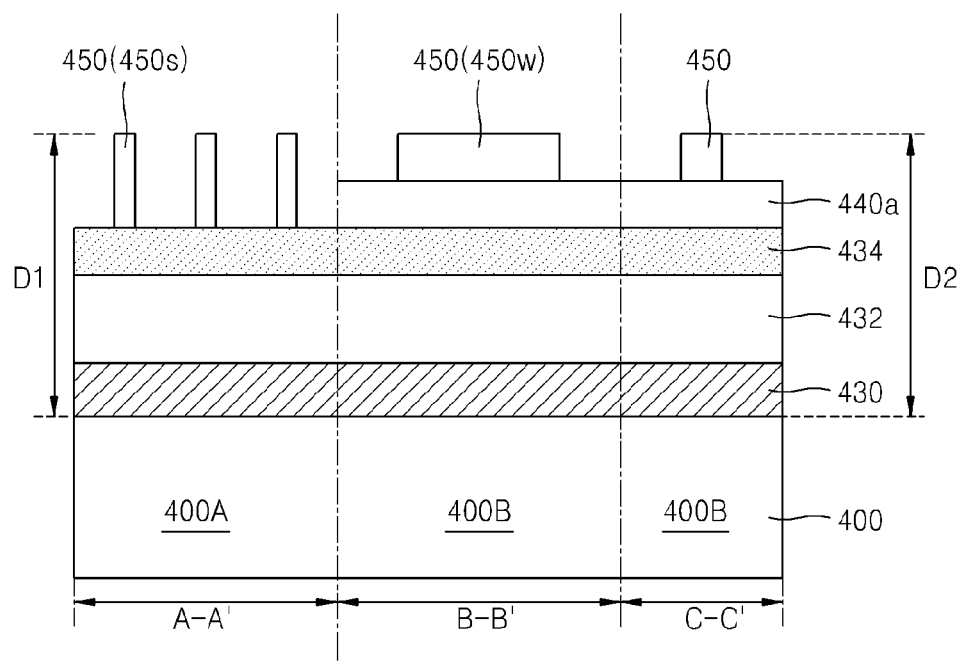

Referring to FIGS. 6A and 6B, a mold mask pattern 450 is provided on the resulting structure. In particular, the mold mask pattern 450 can include relatively narrow first portions 450(450s) that, for example, can correspond with the conductive lines 301 . . . 332 to be formed in the portions of the device where fine, or narrow, features of the feature layer, or layer to be patterned 430, are to be located. The first portions 450 (450s) of the mold mask pattern 450 are positioned on the second hard mask layer 434. The mold mask pattern 450 can further include relatively broad second portions 450(450w) that, for example, can correspond with the ground select line GSL and contacts 352 to be formed in the portions of the device where broad features of the feature layer, or layer to be patterned 430, are to be located. The second portions 450 (450w) of the mold mask pattern 450 are positioned on the remaining portions of the third hard mask layer pattern 440a. Referring to FIG. 6A, this view shows that in some cases, the first portions 450(450s) of the mold mask pattern can be connected to the second portions 450(450w) of the mold mask pattern, whereas, in other cases, they are isolated from each other.

The mold mask layer 450 can comprise, in one embodiment, a carbon-containing layer or a polysilicon layer. In the event a carbon-containing material layer is used, the mold mask layer 450 can comprise a hybrocarbon having an aromatic ring or organic compound comprising its derivative. For example, the mold mask layer material 450 can comprise an organic compound having an aromatic ring, such as phenyl, benzene, or naphthalene. Alternatively, the mold mask layer material 450 can comprise a material having a relatively high carbon level of 85-99 wt % of the organic compound. In one embodiment, the mold mask layer 450 can be applied using a spin-coating process, and can be patterned using conventional photolithography techniques.

Figure 7A:
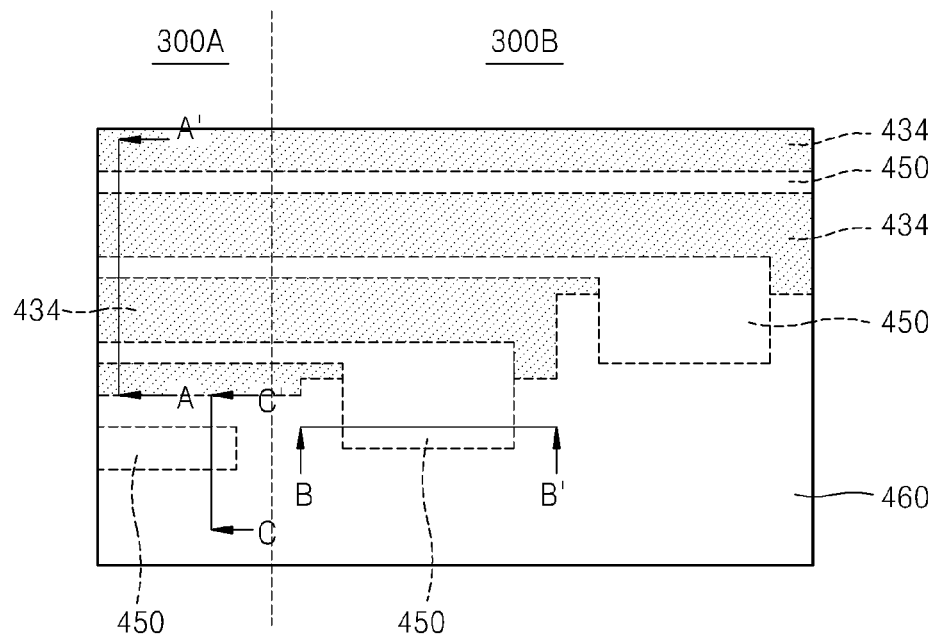
Figure 7B:
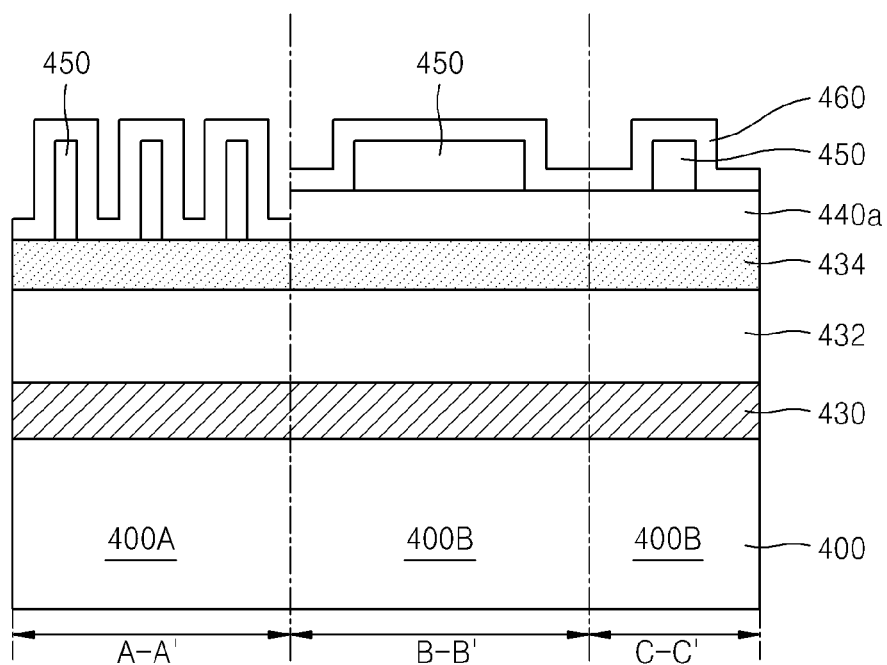

Referring to FIGS. 7A and 7B, a conformal spacer layer 460 is applied to the resulting structure, covering a top and sidewalls of the mold mask layer pattern 450. In one embodiment, the spacer layer 460 is formed of a material that has etch selectivity with regard to the material of the mold mask layer 450 and the underlying second hard mask layer 434.

Figure 8A:
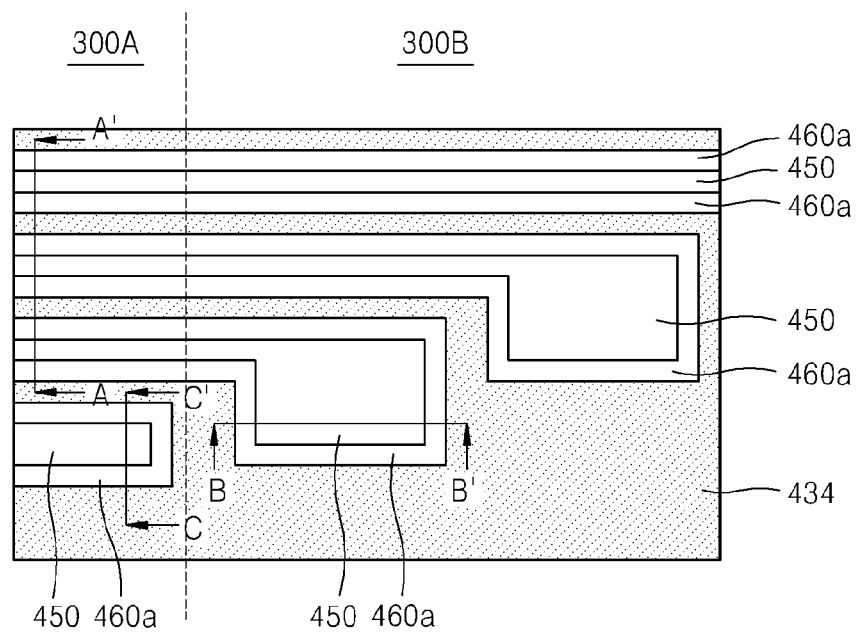
Figure 8B:
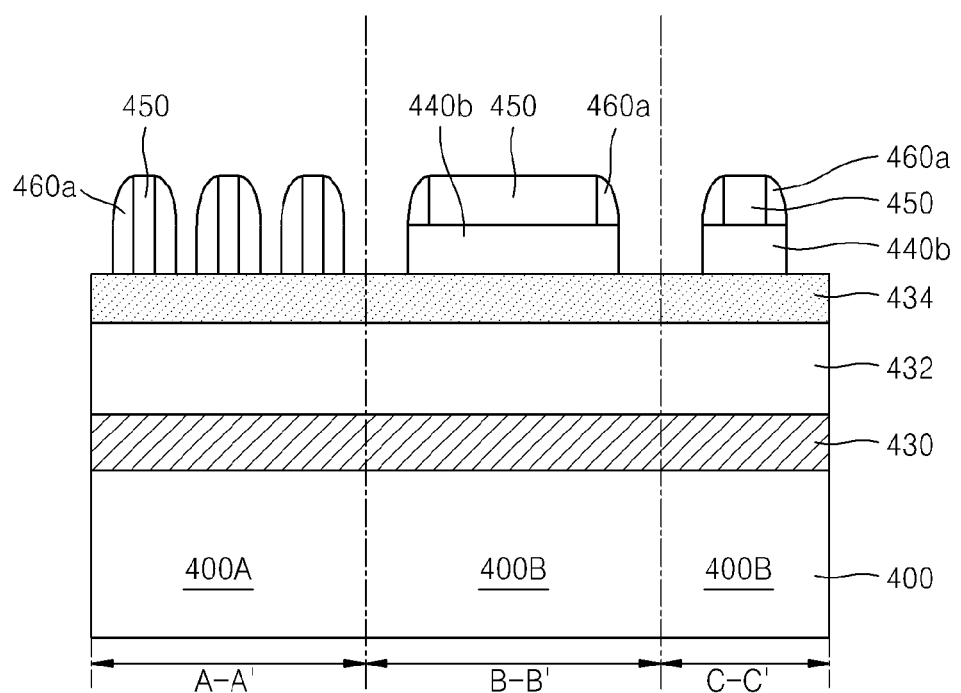

Referring to FIGS. 8A and 8B, the spacer layer 460 is etched to form sidewall spacers 460a at sidewalls of the mold mask layer pattern elements 450. Referring to FIG. 8A, it can be seen that the resulting sidewall spacers 460 border the perimeter of the original mold mask layer pattern elements 450. Following this, the third hard mask layer pattern 440a is etched to form third hard mask layer pattern 440b, using the mold mask layer pattern 450 and the spacers 460a as an etch mask.

Alternatively, in an embodiment where the spacer layer 460 and the third hard mask layer 440 are the same material, the etching of the spacer layer 460 to form the sidewall spacers 460a also results in an etching of the third hard mask layer pattern 440a to form third hard mask layer pattern 440b. In this case, the etching of the sidewall spacers 460a and the third hard mask layer pattern 440b can be performed in a single step.

Figure 9A:
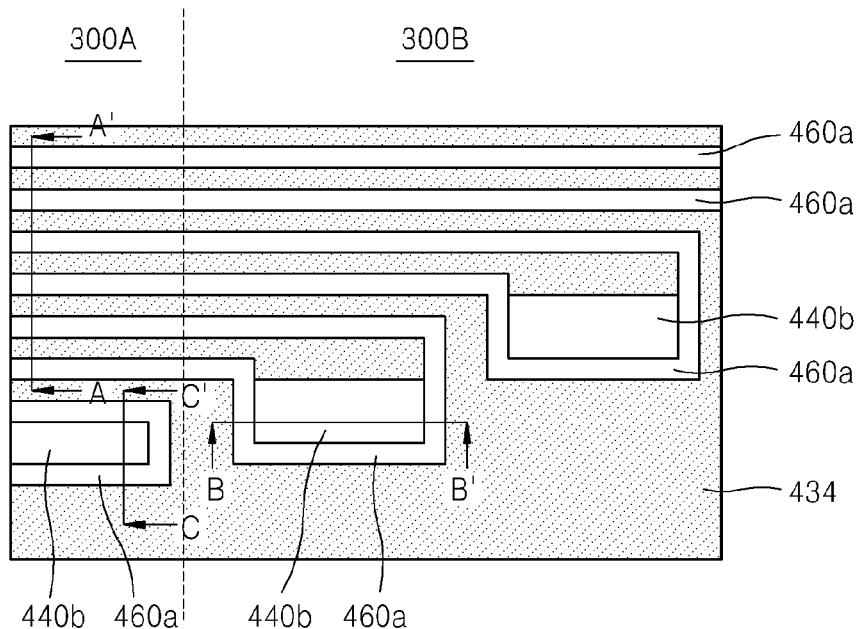
Figure 9B:
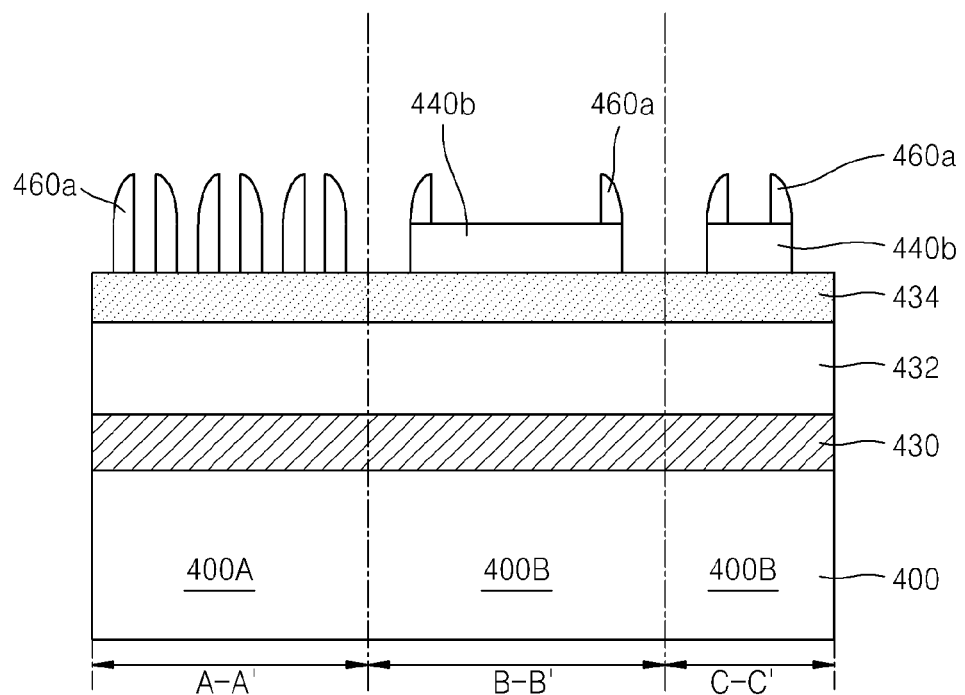

Referring to FIGS. 9A and 9B, the mold mask layer pattern 450 is selectively removed. As a result the spacer structures 460a remain. In particular, the spacer structures 460a can include first spacer structures 460a that are closely spaced apart at a narrow pitch to correspond with the conductive lines 301 . . . 332 to be formed in the portions of the device where fine, or narrow, features of the feature layer, or layer to be patterned 430, are to be located. The first spacer structures 460a are positioned on the second hard mask layer 434 in this example. The first spacer structures 460a can further include second spacer structures 460a that are relatively more further spaced apart at a broader pitch that, for example, can correspond with the ground select line GSL and contacts 352 to be formed in the portions of the device where broad features of the feature layer, or layer to be patterned 430, are to be located. The second spacer structures 460a are positioned on the remaining portions of the third hard mask layer pattern 440b in this example. In a case where the mold mask pattern 450 material comprises a carbon-containing layer, it can be removed by performing an ashing and stripping procedure.

Figure 10A:
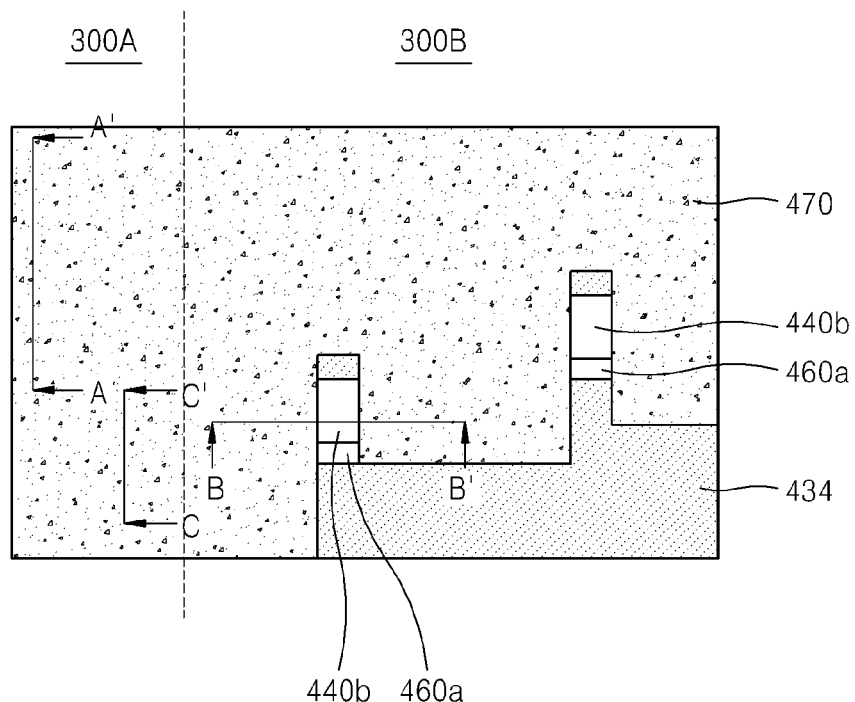
Figure 10B:
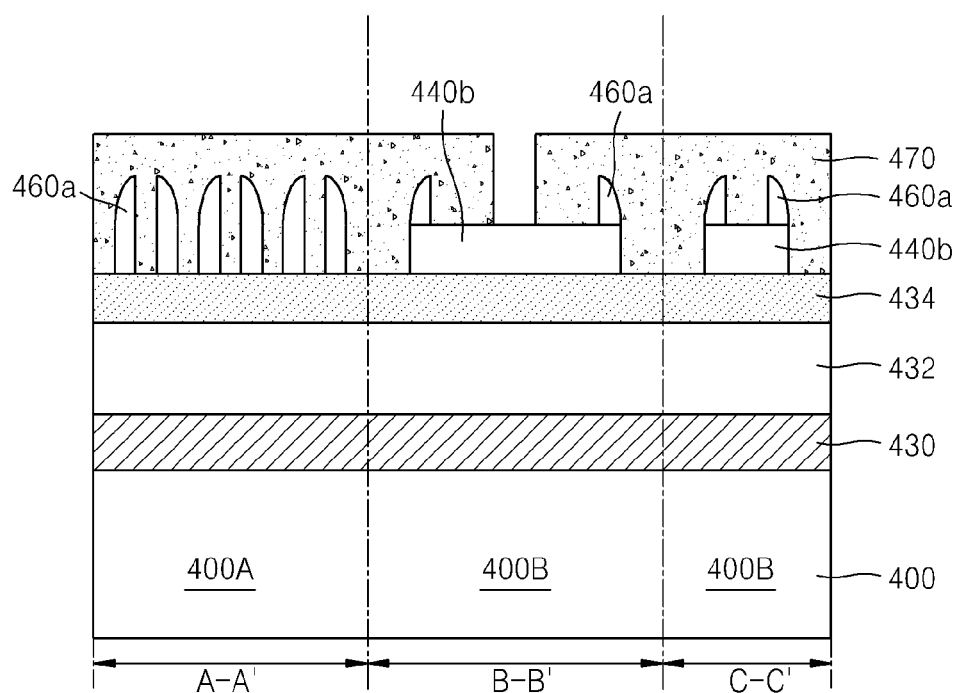

Referring to FIGS. 10A and 10B, a separation mask pattern 470 is applied to the resulting structure. In the present example, the separation mask pattern 470 exposes a portion of the underlying third hard mask layer pattern 440b. In one embodiment, the separation mask pattern 470 is applied using conventional photolithography techniques.

Figure 11A:
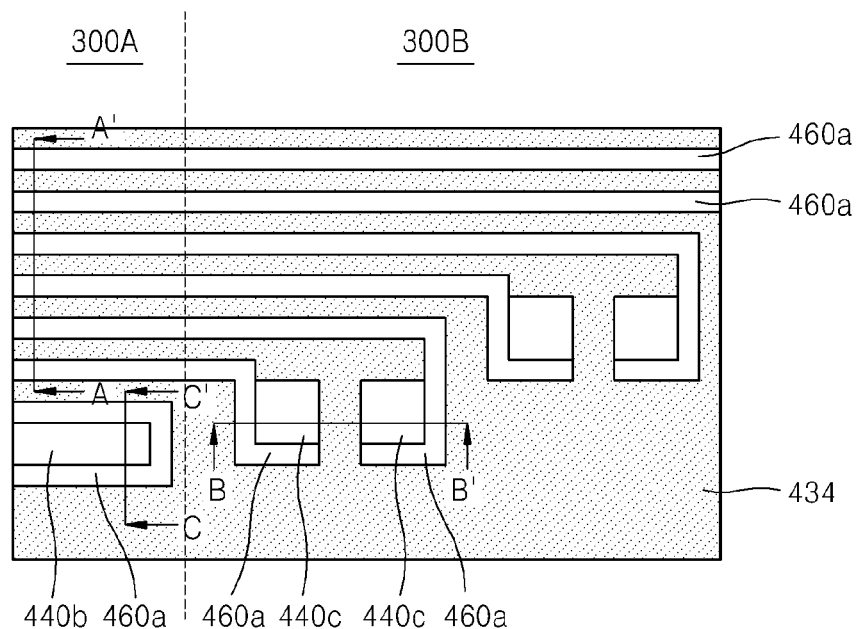
Figure 11B:
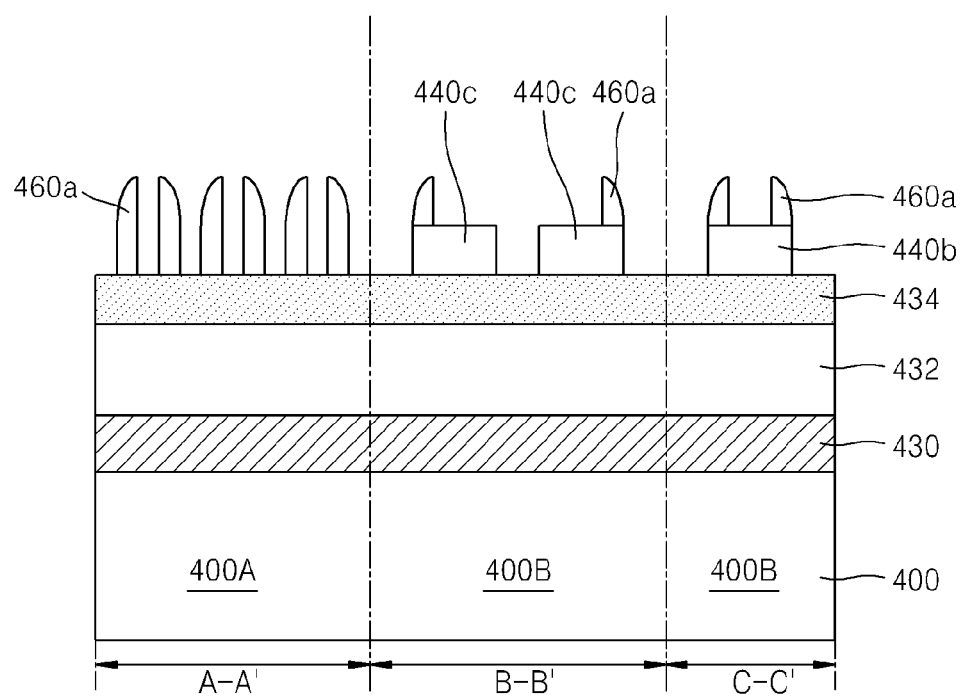

Referring to FIGS. 11A and 11B, the third hard mask layer pattern 440b is etched using the separation mask pattern as an etch mask to form third hard mask layer pattern 440c. In this manner, portions of the third hard mask layer pattern 440b are separated into independent portions 440c. In addition, formerly connected portions of the sidewall spacers 460a are likewise separated into independent portions. In particular, this trimming procedure is applicable to low-density regions of the device, for example, in the cell contact region 300B. In this example, separated portions of the third hard mask layer pattern 440c in the cell contact region 300B correspond with separated contacts 352 to be formed during subsequent processes.

Figure 12A:
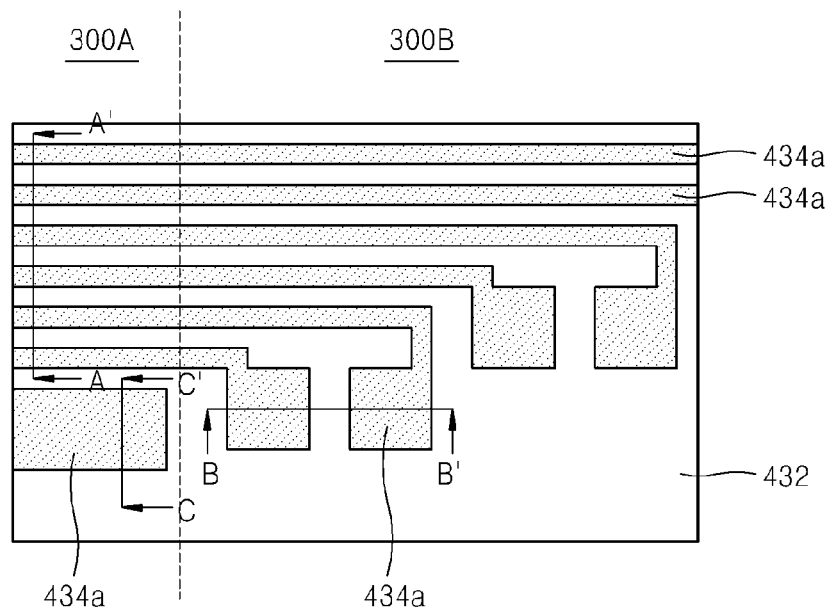
Figure 12B:
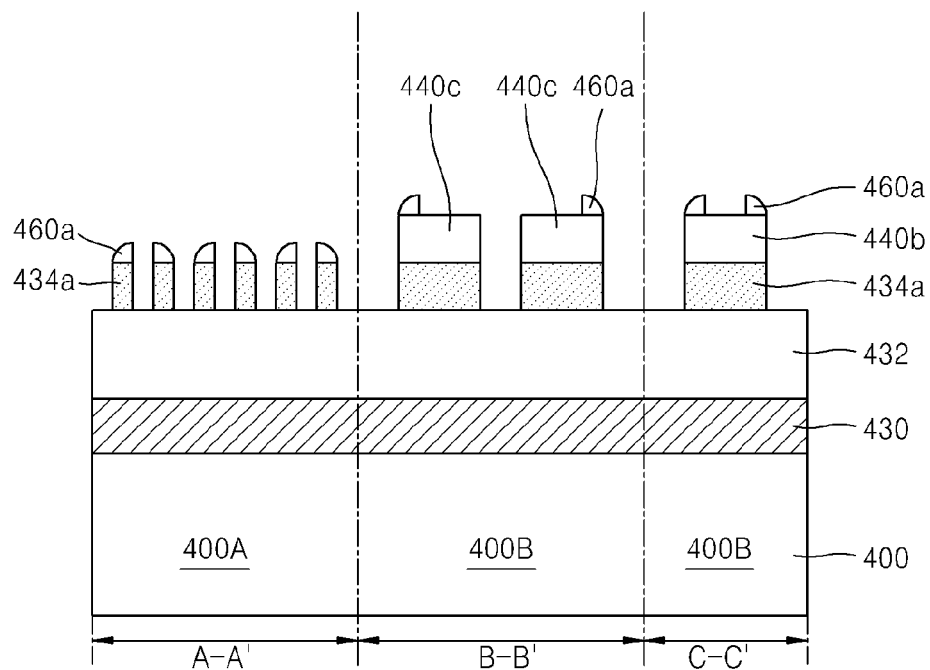

Referring to FIGS. 12A and 12B, the second hard mask layer 434 is etched using the sidewall spacers 460a, the third hard mask pattern 440b and the third hard mask pattern 440c as an etch mask to form a patterned second hard mask layer 434a.

Figure 13A:
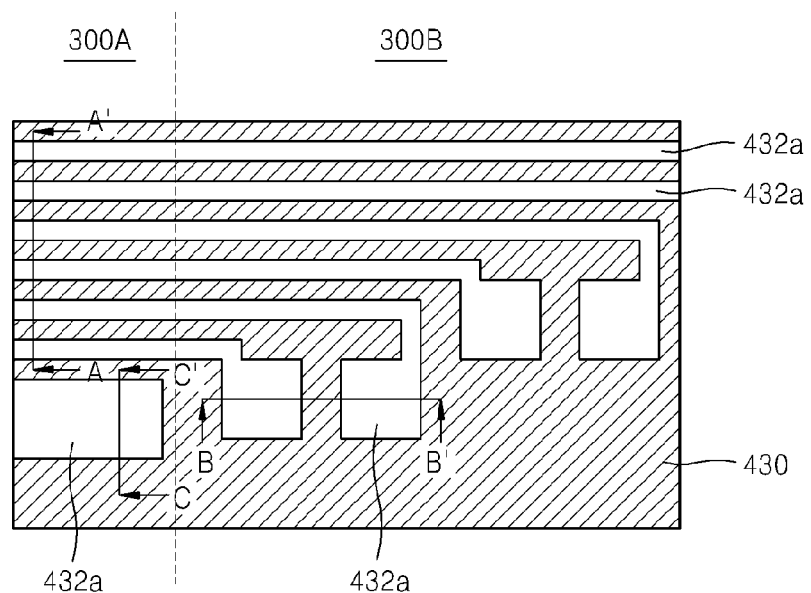
Figure 13B:
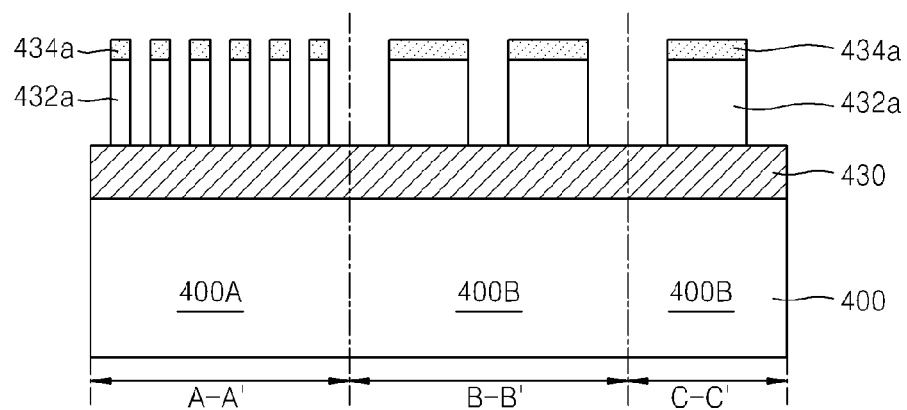

Referring to FIGS. 13A and 13B, the first hard mask layer 432 is etched using the patterned second hard mask layer 434a and any remaining portions of the sidewall spacers 460a, the third hard mask pattern 440b and the third hard mask pattern 440c as an etch mask to form a patterned first hard mask layer 432a. As a result of this procedure, the feature layer, or layer to be patterned 430 is exposed.

Figure 14A:
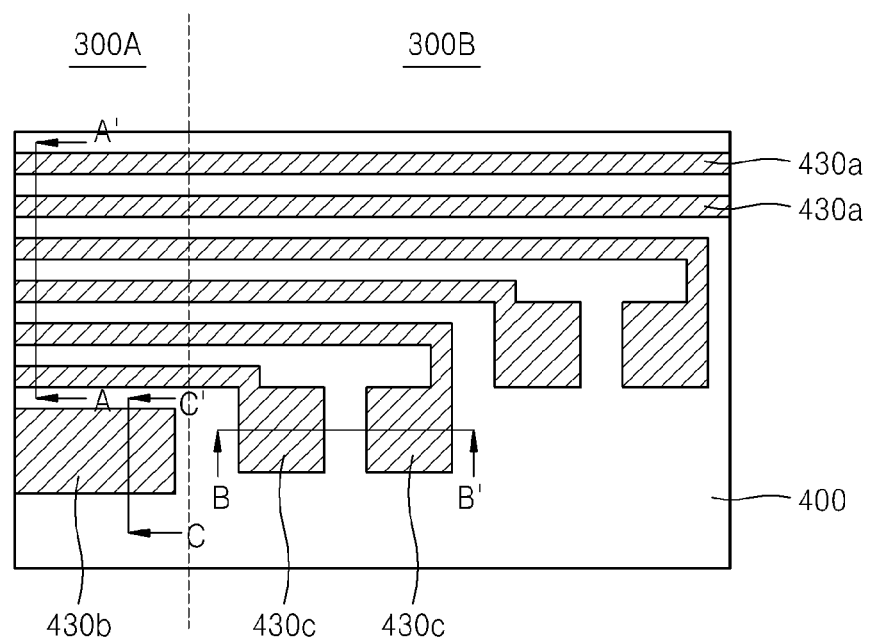
Figure 14B:
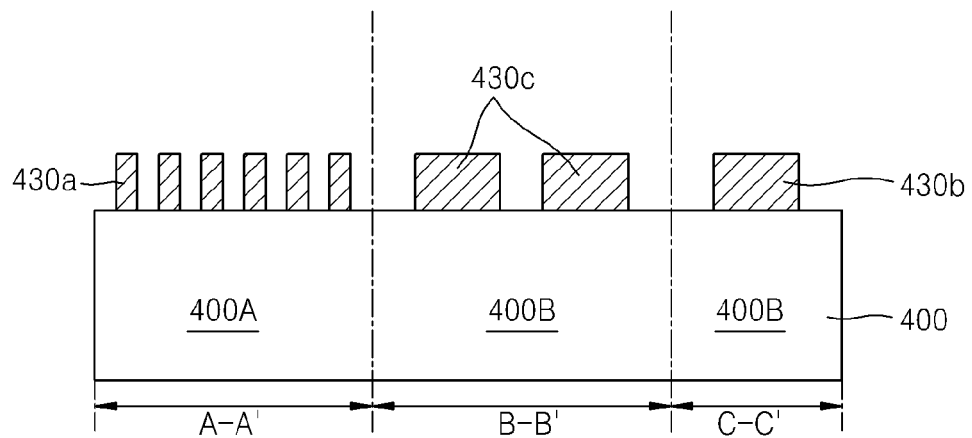

Referring to FIGS. 14A and 14B, the feature layer, or layer to be patterned 430, is etched and patterned using the patterned first hard mask layer 432a and any remaining portions of the second hard mask layer pattern 434a as an etch mask to form a patterned feature layer 430. The patterned feature layer 430 in this example, includes fine, or narrow, first features 430a which operate as conductive lines 301 . . . 332 of the device. The first features 430a can be of a fine width or fine pitch that is less than a width or pitch that would otherwise be attainable by the resolution of the photolithography system used. For example, the first features 430a can be one-half of the otherwise attainable width or pitch. In addition, the patterned feature layer 430, includes relatively broad second and third features 430b, 430c which operate as the ground select line GSL and contacts 352 of the device.

It will be apparent that the first and second hard mask layers 432, 434 and the steps involved in their subsequent patterning are optional, and not required, depending on the application. Multiple masking layers are desirable in fabrication processes as pattern widths continue to decrease in size. The number of layers and the types of materials used for the mask layers depend on the level of integration and the fabrication process employed.

Figure 15:
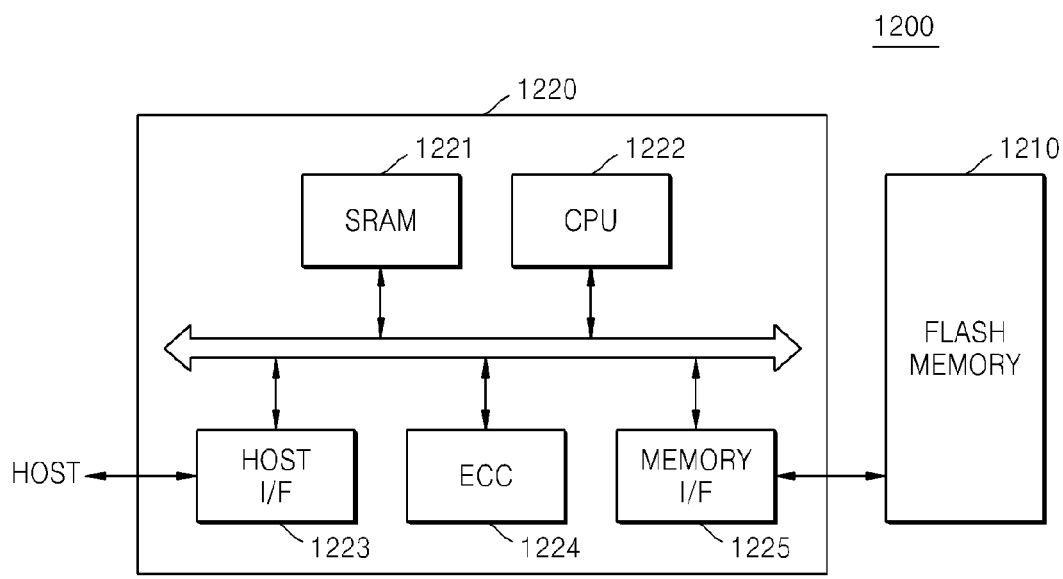
FIG. 15 is a block diagram of a memory card that includes a semiconductor device formed in accordance with the embodiments of the present invention.

FIG. 15 is a block diagram of a memory card that includes a semiconductor device in accordance with the embodiments of the present invention. The memory card 1200 includes a memory controller 1220 that generates command and address signals C/A and a memory module 1210 for example, flash memory 1210 that includes one or a plurality of flash memory devices. The memory controller 1220 includes a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device includes a plurality of addressable memory cells and a decoder that receives the receives the command and address signals, and that generates a row signal and a column signal for accessing at least one of the addressable memory cells during programming and read operations.

Each of the components of the memory card 1200, including the memory controller 1220, electronics 1221, 1222, 1223, 1224, and 1225 included on the memory controller 1220 and the memory module 1210 can be formed to include fine patterns using processing techniques in accordance with the embodiments disclosed herein.

Figure 16:
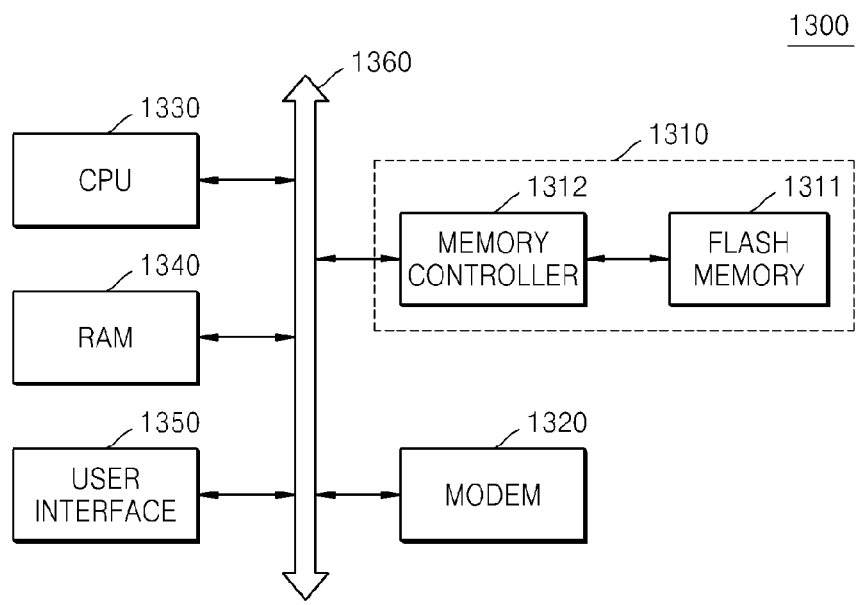
FIG. 16 is a block diagram of a memory system that employs a memory module, formed in accordance with the embodiments of the present invention.

FIG. 16 is a block diagram of a memory system 1300 that employs a memory module 1310, for example, of the type described herein. The memory system 1300 includes a processor 1330, random access memory 1340, user interface 1350 and modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can be formed to include fine patterns using processing techniques in accordance with the embodiments disclosed herein. The memory system 1300 can find application in any of a number of electronic applications, for example, those found in consumer electronic devices such as solid state drives (SSD), CMOS image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
a substrate having a cell array region and a cell contact region;
a plurality of finely patterned conductive lines formed on the substrate, the plurality of finely patterned conductive lines extending parallel to one another in a first direction in the cell array region and in the cell contact region of the substrate;
a plurality of broadly patterned conductive contacts formed on the substrate, the plurality of broadly patterned conductive contacts extending parallel to one another in a second direction in the cell contact region of the substrate, wherein the second direction is transverse the first direction;

a first pair of neighboring conductive contacts of the plurality of broadly patterned conductive contacts and a second pair of neighboring conductive contacts of the plurality of broadly patterned conductive contacts, the second pair of neighboring conductive contacts being closest to the first pair of neighboring conductive contacts from among other broadly patterned conductive contacts; and a pair of neighboring finely patterned conductive lines of the plurality of finely patterned conductive lines, wherein one of the pair of neighboring finely patterned conductive lines is closest to the other of the pair of neighboring finely patterned conductive lines, wherein a portion of at least one of the pair of neighboring finely patterned conductive lines extends in the second direction in the cell contact region, and wherein a sidewall of the portion of the at least one of the pair of neighboring finely patterned conductive lines is aligned with a corresponding sidewall of a corresponding one of the first pair of neighboring conductive contacts, wherein each contact of the first pair of neighboring conductive contacts has a sidewall being in contact with a corresponding finely patterned conductive line of the pair of neighboring finely patterned conductive lines, wherein each contact of the first pair of neighboring conductive contacts extends outward from its respective sidewall being in contact with the corresponding finely patterned conductive line of the pair of neighboring finely patterned conductive lines toward the other contact of the first pair of neighboring conductive contacts, and wherein the first pair of neighboring conductive contacts is not overlapping with the second pair of neighboring conductive contacts along the first direction.

2. The semiconductor device of claim 1, wherein end portions of each of the plurality of finely patterned conductive lines extend in the second direction of the cell contact region, and wherein the end portion of each of the plurality of finely patterned conductive lines is electrically connected to a corresponding one of the plurality of broadly patterned conductive contacts in the cell contact region.

3. The semiconductor device of claim 1 wherein the contacts of the first pair of neighboring conductive contacts are isolated from each other.

4. The semiconductor device of claim 1, wherein the first direction is perpendicular to the second direction.

5. The semiconductor device of claim 1, wherein the plurality of finely patterned conductive lines are spaced apart from each other by distances that are less than those readily attainable under the resolution of the photolithography system used in their formation.

6. The semiconductor device of claim 5, wherein the plurality of broadly patterned conductive contacts comprise feature sizes readily attainable under the resolution of the photolithography system used in their formation.

7. The semiconductor device of claim 1, wherein at least one of the plurality of finely patterned conductive lines is electrically connected to at least one of the plurality of broadly patterned conductive contacts.

8. The semiconductor device of claim 1, wherein the sidewall of each of the portions of the finely patterned conductive lines extending in the second direction is self-aligned with the corresponding sidewall of the corresponding one of the plurality of broadly patterned conductive contacts.

9. The semiconductor device of claim 1, wherein the plurality of finely patterned conductive lines and the plurality of broadly patterned conductive contacts are simultaneously etched from a feature layer on the substrate.

10. The semiconductor device of claim 9, wherein the feature layer comprises a material selected from the group consisting of tungsten or aluminum.

11. The semiconductor device of claim 1, wherein the substrate further includes a peripheral region.

12. The semiconductor device of claim 11 further comprising:

a plurality of addressable memory cells in the cell array region; and a decoder in the peripheral region that receives command and address signals from an external device and that generates a row signal and a column signal for accessing at least one of the addressable memory cells during programming and read operations.

13. The semiconductor device of claim 1, wherein the plurality of finely patterned conductive lines are spaced apart at a narrow pitch, and wherein each of the broadly patterned contacts are spaced apart at a broad pitch.

14. The semiconductor device of claim 1 further comprising a plurality of pairs of contacts of the plurality of broadly patterned conductive contacts, wherein the plurality of pairs of contacts are arranged in a step-structure formation extending in the first direction, and wherein each pair of contacts is shifted a distance in the second direction relative to its neighboring pairs.

15. The semiconductor device of claim 1, wherein the plurality of conductive lines are bit lines of a memory device.

16. The semiconductor device of claim 1, wherein bottom surfaces of the plurality of finely patterned conductive lines and the plurality of broadly patterned conductive contacts are coplanar.

* * * * *